United States Patent [19]

Goldstein

[11] 4,379,245
[45] Apr. 5, 1983

[54] MANUALLY OPERABLE ROTARY PULSE GENERATING APPARATUS FOR PULSE COUNTING AND SIMILAR APPLICATIONS

[75] Inventor: Richard Goldstein, Northbrook, Ill.

[73] Assignee: Dynascan Corporation, Chicago, Ill.

[21] Appl. No.: 132,090

[22] Filed: Mar. 20, 1980

[51] Int. Cl.³ .............................................. H01L 41/08
[52] U.S. Cl. .................................. 310/319; 310/339; 310/328
[58] Field of Search ....................... 310/339, 314–319, 310/328; 361/260; 431/255

[56] References Cited

U.S. PATENT DOCUMENTS

| 3,174,419 | 3/1965 | Sable | 310/339 X |
| 3,970,420 | 7/1976 | Goto | 431/255 |
| 4,156,825 | 5/1979 | Kondo et al. | 310/339 |

FOREIGN PATENT DOCUMENTS 2804048 8/1979 Fed. Rep. of Germany ...... 310/339

Primary Examiner—Mark O. Budd
Attorney, Agent, or Firm—Wallenstein, Wagner, Hattis, Strampel & Aubel

[57] ABSTRACT

A manually operable pulse generating apparatus comprises a dial knob assembly having a outer grippable knob member rotatably mounted around an inner knob member connected to an operating shaft carrying a ratchet wheel-forming cam having saw-toothed ratchet teeth-forming lobes. Each lobe has a gradually rising leading side and a sharply dropping trailing side. The outer knob member is connected to the inner knob member through a one-way clutch so that the outer knob member can be rotated in one direction without rotating the inner knob member, the inner knob member rotating with the outer knob member when rotated in the opposite direction. Where the outer knob member is opaque, it contains numbered markings for identifying the degree of rotation imparted thereto relative to a stationary index mark on a control panel over which the dial knob assembly is mounted. For some applications, the outer knob member may be transparent in which case the numbered markings referred to are on the inner knob member. A pawl-forming, force-transmitting spring or spring-urged member normally rests in the crotch between successive ratchet teeth-forming lobes of the cam where it is in a partially tensed condition to form a detent for the shaft. The rotation of the outer knob member in said other direction rotates the cam and causes the pawl to ride up the gradually rising side of a cam lobe so that the tension in the pawl initially slowly increases.

10 Claims, 7 Drawing Figures

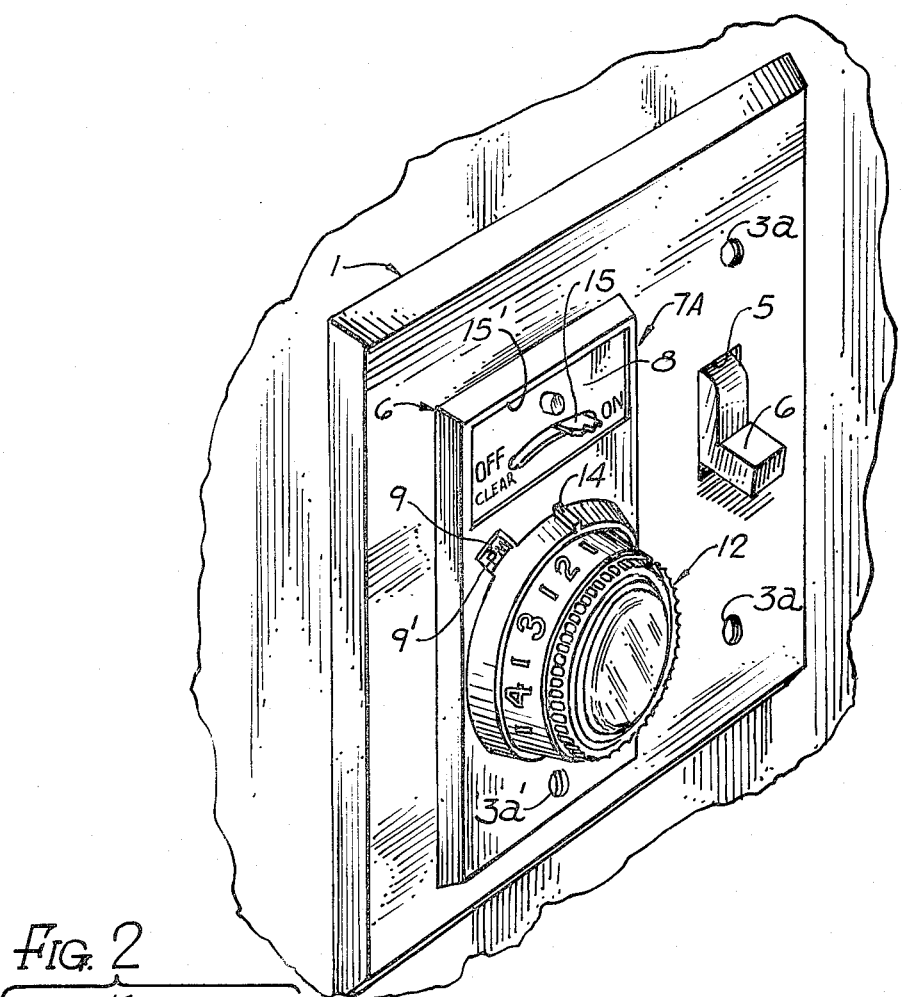
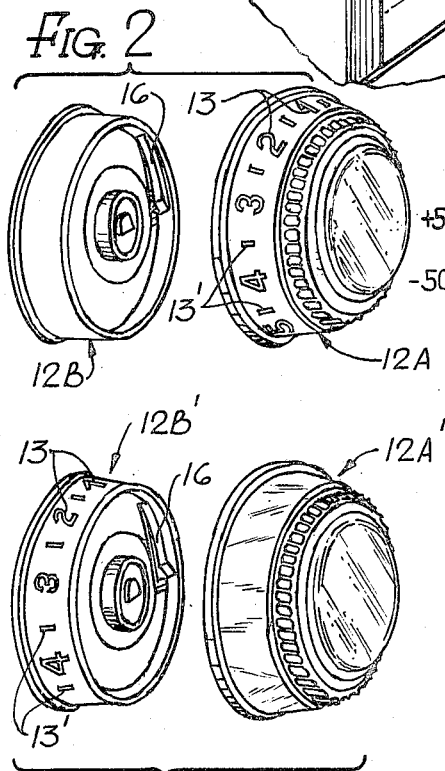
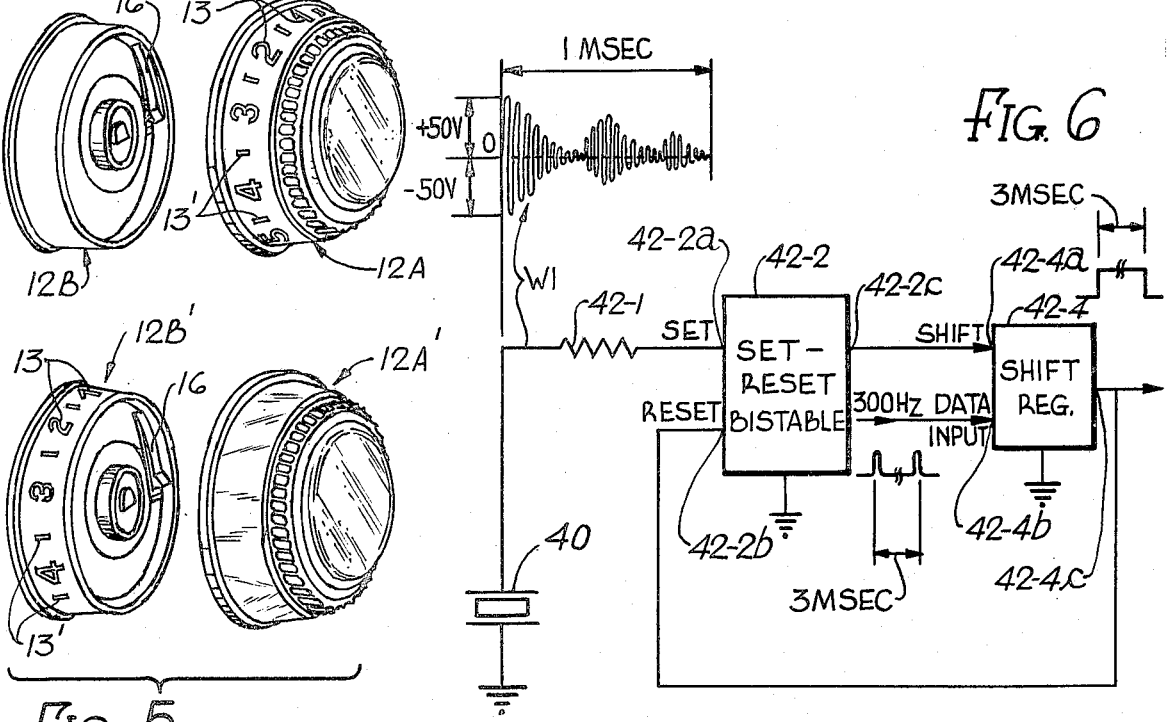

MANUALLY OPERABLE ROTARY PULSE GENERATING APPARATUS FOR PULSE COUNTING AND SIMILAR APPLICATIONS

BACKGROUND AND SUMMARY OF INVENTION

This invention relates to pulse generating apparatus used to feed pulse counters in timers and electrical devices which use manual controls which produce pulses which are counted as the controls are advanced in discrete steps.

Many digital controllers require the system to receive a numerical input from a manually operable rotating shaft or dial. When the input is to be effected by a person rotating a numbered dial, it is necessary that the system receive the exact number of pulses indicated by the markings on the dial. For this purpose, prior art teaches the use of cam operated contacts or printed circuit switches in which a wiper passes over small deposited metallic areas, the number of such areas corresponding to the number of pulses desired in a single rotation of the dial.

It is well known that cam operated contacts and wiping contacts do not produce a single clean "make" and "break" of the electrical circuit, but, instead, produce a series of rapid multiple closures because of bounce or wiper contact noise characteristics. Since digital circuits generally respond faster than the bounce or wiper noise pulses, it is necessary to include "debounce" circuitry so that a series of very rapid pulses will be converted to a single pulse corresponding to a single cam point or contact wiping point. Such debounce circuitry is well known in the art. In digital systems using a synchronizing "clock", the debounce period can easily be chosen to be a multiple of the clock period. Since most system clocks operate at relatively high frequencies their period is short enough that great flexibility is available for choosing the length of the debounce period.

In a manually operable rotary switch of the type described, the rate of rotation is controlled by the user. If a large number of pulses per rotation is desired, the angular rotation between pulses will be small and rapid rotation will cause the pulses to be spaced in time as little as a few milliseconds apart. If the duration of the bounce phenomena exceeds the possible time interval for rotation between switching points, it is obvious that a debounce period long enough to guarantee a single output pulse from each switch point would prevent generating the next desired output pulse. For a cam operated switch, this could require a very careful design of the spring and contact system to minimize the bounce, and very careful control of manufacturing with respect to both materials, assembly methods and testing to assure that the bounce duration did not exceed the maximum specified. Thus, the cost of such a system to assure reliable performance is quite high compared to the switch of this invention.

If a printed circuit type manually operable rotary switch is employed, the cost is considerably greater than the switch of this invention, since the technology of proper circuit metallization and wiper contact performance is quite complex. In addition, the printed circuit switch has a seemingly impossible problem to solve in this application. This problem arises because the switch cannot be made completely noiseless as the wiper moves over the metallic area, especially after some period of use causing wear. Therefore, it is also necessary to include debounce circuitry for printed circuit switches. In this application, the slowest rate of rotation would determine the time duration required for the debounce period. A practical period for the slowest anticipated rotation would greatly exceed the duration of the time interval for the most rapid anticipated rotation, thus precluding the selection of a debounce interval to satisfy the requirement.

In addition to the problems described above, manually operable cam operated contact switches and printed circuit switches suffer from another problem even more difficult to solve. This problem concerns the ability of the user to "tease" the switch by rotating it slightly between detent points or ratchet points; that is, by rotation back and forth far enough to open and close the cam operated contacts or move the wiper on and off the metallic area, but not far enough to engage the next ratchet tooth (which would prevent backward movement) or fall into the next detent position. This results in the possibility that extra pulses are generated between dial marks, thus creating an erroneous numerical input to the system. While various mechanical schemes to avoid this problem could be envisioned, none appear to have the simplicity and low cost of this invention.

An ideal manually operable pulse-producing device for the application described: (1) would, with the use of a simple debouncing circuit, produce a single pulse corresponding to each dial mark as the dial mark is rotated past an index mark; (2) cannot be teased between positions; (3) provides the user with some feedback such as tactile, aural, or both, as each dial mark generates a pulse; and (4) is of simple construction for low cost and reliable performance.

Accordingly, the object of the present invention is to provide a manually operable, electrical pulse-producing apparatus, preferably for the applications described, which have one or more, and preferably all of the desirable features of this ideal switch just described.

The manually operable pulse-producing apparatus of the invention utilizes a pulsing technique heretofore used in the prior art in a different manner and in a different environment than that of the present invention, to produce with each discrete movement of a rotable cam member a series of easy-to-debounce pulses resembling a damped sine wave. Thus, some prior pulse-producing devices utilize the piezo-electric effect of a piezo-electric ceramic element which is initially placed under a relatively small compressive force by a spring to generate electric pulses for energizing lighting or similar devices. Either the spring, or a separate spring-urged arm, engaging the piezo-electric element is positioned along the periphery of a motor driven cam having cam lobes thereon so that the rotation of the cam member will periodically vary the degree of the compression of the piezo-electric element to generate voltage pulses. In one such device, as shown in U.S. Pat. No. 3,174,419, a spring-urged arm rides on a cam and, starting from a point where it is located at a low point on the cam, as the cam is rotated, the arm is moved along a gradually rising side of a cam lobe which gradually increases the stress of a piezo-electric element. An insignificant electrical output is produced at the output terminals of the piezo-electric element during such gradual increase in the stress on the piezo-electric element. Each cam lobe has a steep trailing edge, so that when the spring-urged arm falls suddenly to a low point on the cam, a sudden high amplitude pulse waveform is generated by the piezo-electric element.

In accordance with another feature of the invention, the pulse output of a piezo-electric element operated as described is uniquely used as a pulse source coupled through a debouncing circuit to a circuit responsive to the number of pulses fed thereto, like a pulse responsive circuit of a timer.

In accordance with another feature of my invention, the cam is connected to a manually operable dial knob and the cam forms a ratchet wheel with sawtooth-shaped cam lobes, each defined by a gradually rising leading side terminating in a sharply dropping trailing side. In the most preferred form of my invention, a spring rides on the cam, the spring having a pawl-forming end normally urged into the crotch between successive cam lobes, so that the spring acts as a detent and stops rotation of the ratchet-forming cam in one direction and permits the cam to be rotated in the other direction as the pawl-forming end of the spring rides up along the gradually rising side of a cam lobe. The pawl-forming end of the spring preferably joins a curved portion closely extending part way around a cylindrical pivot-forming rod, where the spring terminates in a flat end bearing against one end of a piezo-electric element to place the element under an initial small degree of compression.

It is thus apparent that the spring, which less desirably can be a spring-urged arm, uniquely forms the double function of both acting as a detent for enabling the discrete advancement of the cam member connected to a rotatable dial knob and as a force-transmitting member to the piezo-electric element.

The dial knob has associated therewith indicia identifying various progressively increasing numbers and/or other markers which are alignable with an index mark at each detented position of the dial knob so that, as the dial knob is advanced from an initial reference point to a selected number or other marker, a corresponding number of pulses are generated at the output of a debouncing circuit coupled to the output of the piezo-electric element.

In accordance with another feature of the invention, to permit the dial knob to be moved into a starting or zero reference position without generating any pulses, the dial knob is made in two pieces, preferably an outer hard grippable knob member which is coupled through a one-way clutch to an inner part which may be the cam shaft, or an inner knob member around which the outer knob member is rotatably mounted, so that the outer knob member may be rotated in one direction to set the dial knob assembly to zero without rotating the cam shaft. When the outer knob member is rotated from said zero position in the opposite operating direction, it will advance the cam shaft to generate one easily debounced pulse train as the outer knob member is moved to the next position.

DESCRIPTION OF DRAWINGS

FIG. 1 is a perspective view of a conventional two-station wall switch cover plate over and behind one station of which is mounted an electric timer having a timer program setting rotatable time dial knob assembly projecting from a control panel in front of the cover plate, and which dial knob assembly, together with the other elements shown in FIG. 5, form a preferred manually operable rotary pulse generating apparatus of the invention;

FIG. 2 is an exploded view of the outer and inner knob members making up the time dial knob assembly shown in FIG. 1;

FIG. 5 is an exploded view of a modified time dial knob assembly which can be substituted for the time dial knob assembly in FIG. 1, where the time setting operation is modified to accommodate the same; and FIG. 6 is a debouncing circuit for converting the damped sine wave output of the piezo-electric element to a single pulse.

DESCRIPTION OF EXEMPLARY FORM OF INVENTION

Figure 3:
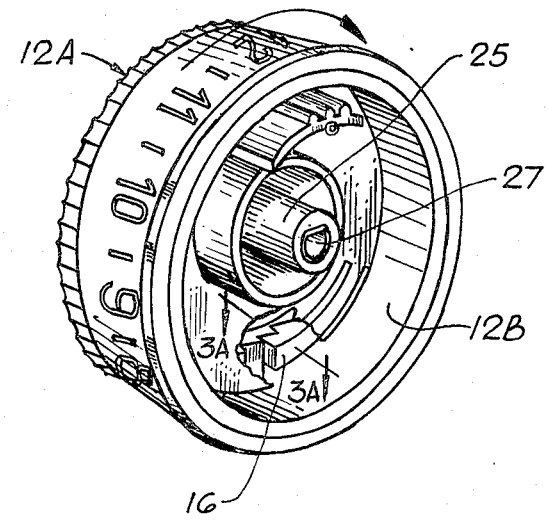
FIG. 3 is a perspective view of the inner side of the time dial knob assembly of FIG. 1.

Referring now to FIGS. 1 and 2, there is shown a typical dual switch station wall switch cover plate 1 which is mounted over a wall switch opening normally accommodating two toggle switches. As illustrated, the cover plate 1 has on one side thereof a vertical toggle arm-receiving slot 5 through which projects the usual toggle switch arm 6 for operating a switch unit mounted behind the plate upon a metal strap (not shown), as is conventional. The toggle switch arm 6 controls a light circuit different from that controlled by a timer 7 mounted at the other switch station of the cover plate 1. The cover plate 1 is anchored in place in a conventional way by a pair of anchoring screws 3a—3a and below the plate slot 5. The timer 7 has a front housing sub-assembly 7A with a control panel 8 upon which various manually operable controls are accessible. Anchoring screw 3a' anchors the timer front housing sub-assembly 7A and the switch plate 1 to a metal strap (not shown).

One of the timer controls referred to is a rotatable and depressable time dial knob assembly 12. This time dial knob assembly shown in exploded form in FIG. 2 includes an outer knob member 12A which may be made of opaque synthetic plastic material having on the outer periphery thereof hour markings 13 and half-hour markers 13'. Since the half-hour markers are adjacent and related to the adjacent hour numbers, the half-hour markers are included in what is sometimes referred to as "numbered markings". These markings are positionable adjacent a stationary index mark 14 on the control panel 8. The outer control knob member 12A is rotatably mounted around an inner knob member 12B and these knob members are interconnected by a one-way clutch to be described, so that the outer knob member is rotatable in a counter-clockwise direction without transmitting the rotation thereof to the inner knob member 12B, and so that rotation of the outer knob member in a clockwise direction imparts rotation to the inner knob member bringing progressively increasing hour markers opposite the index mark 19. The control panel 8 has a window 9 in which is visible an "AM" and "PM" indicator plate 9' which is shifted between "AM" and "PM" indicating positions each time the dial assemble 12 rotated clockwise one revolution. The control panel also has a slot 15' through wich a timer condition setting arm 15 extends to connect or disconnect power to the timer.

Figure 3A:
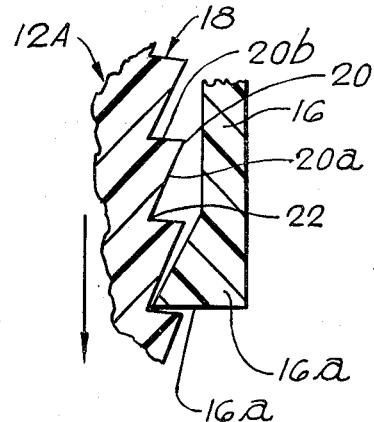
FIG. 3A is a greatly enlarged fragmentary sectional view through the time dial knob assembly of FIG. 3, taken along line 3A—3A therein.

This one-way clutch, which may take a number of different forms, preferably has the construction shown in FIGS. 3 and 3A to which reference is now made. As shown in these Figures, the inner knob member 12B has an acuate resilient pawl-forming arm 16 having on the forwardly facing side of the end thereof a pointed pawl-forming portion 16a. The resilient arm 16 forces the pawl-forming portion 16a against a rearwardly facing ratchet teeth-forming surface 18 of the outer knob member 12A. The ratchet teeth-forming surface 18 presents individual teeth 20 each having a gradually rising leading side 20a and a sharply dropping trailing side 20b. The pointed pawl-forming portion 16a normally rests in the crotch 22 formed between the sharply dropping side 29b of one of the teeth 20 and the gradually rising side 20a of the next tooth. Counter-clockwise rotation of the outer knob 12A causes the pointed pawl-forming portion 16a to ride up the gradually rising side 16a of the adjacent tooth 20 and so slip by the same. Clockwise rotation of the outer knob member 12a causes the leading flat side 16a' of the pawl-forming portion 16a to bear against the sharply trailing side 20b of the adjacent tooth 20 so that the inner knob member 12B is rotated with the outer knob member 12A.

Figure 4:
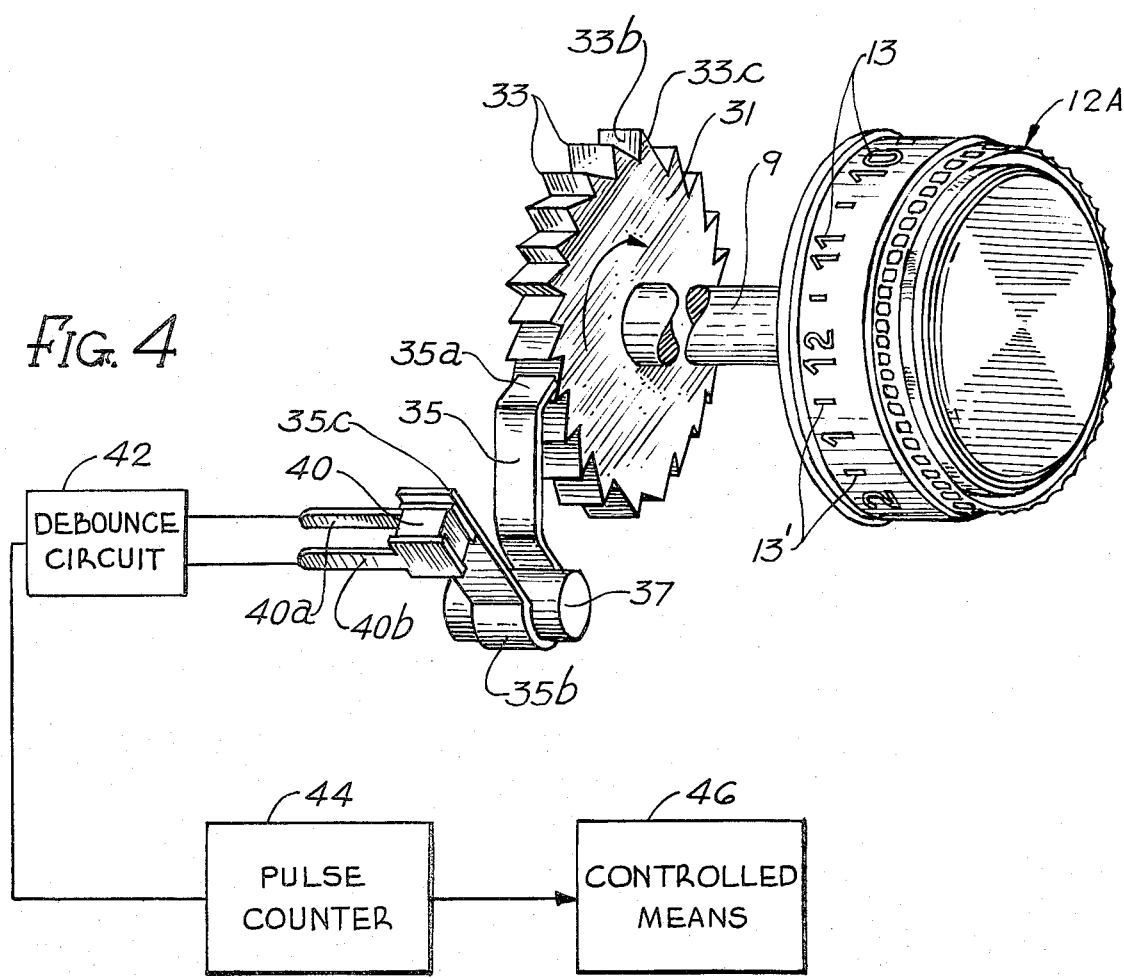
FIG. 4 is a perspective view of the time dial knob assembly of FIGS. 1 and 3 in a position partially rotated to its next indexed position and other mechanical and electromechanical elements including a piezo-electric element, completing the manually operable rotary pulse generating apparatus portion of the timer shown in FIG. 1, the figure further showing electrical circuits in block form coupled to the output terminals of the piezo-electric element.

The inner knob member 12A has a rearwardly projecting hollow hub 25 with a non-circular socket 27 into which frictionally fits the non-circular end of a control shaft 29 shown in FIG. 4. This shaft 29 carries a ratchet wheel-forming cam 31 having ratchet teeth-forming lobes 33. Each of these ratchet teeth-forming lobes 33 has a gradually rising side 33a and a sharply dropping side 33b. The cam 31 together with an associate pawl-forming and force-transmitting spring 35 form a detenting means to provide 24 discrete positions of the shaft 29 where the numbered markings 13 and 13' on the outer knob member 12A are brought individually into alignment with the stationary index mark 14. It can thus be seen that as the dial knob assembly 12 is rotated a full revolution in a clockwise direction, all of the hour numbers and one-half hour markers 13 and 13' will have been brought into alignment with the index mark 14.

Spring 35 has a flat pawl-forming end 35a which normally urges the cam 31 in a counter-clockwise direction into a position where the pawl-forming end 35a engages the crotch of the recess defined between adjacent ratchet teeth-forming lobes 33 of the cam.

The flat pawl-forming end 35a of the spring 35 joins a rounded portion 35b which closely extends part way around a cylindrical pivot-forming rod 37, the spring terminating in a flat end 35c which bears against one side of a stationery piezo-electric ceramic element 40. The flat end 35c of the spring 35 places an initial compressive force on the piezo-electric element 40, which force is progressively increased as the cam 31 is rotated in a clockwise direction to move the pawl-forming end 35a of the spring 35 toward the other end 35c thereof, this action increasing the compressive force of the flat end 35c against the piezo-electric element 40 until most of this force is suddenly relieved, as the pawl-forming end 35a of spring 35 drops suddenly from the high point of a cam lobe. This produces an audible "click" and generates a large amplitude damped sine wave voltage W1 at the output terminals 40a–40b of the piezo-electric element 40. There is practically little or no voltage generated across the terminals 40a and 40b when the stress on the piezo-electric element is slowly increased as the pawl-forming end 35a of spring 35 rides up the gradually rising side 35a of a cam lobe, so that any "teasing" of the time dial knob assembly 12 or ordinary vibration will not generate any count error-producing pulses at the piezo-electric element terminals 40a or 40b.

FIG. 4 shows the piezo-electric element terminals 40a and 40b connected to the input of a debouncing circuit 42 which generates a single pulse from the decaying sine wave voltage W1 to the input thereof. The output of the debouncing circuit 42 is coupled to a pulse counter 44 which is periodically reset so that the count in the pulse counter will indicate the degree to which the dial knob assembly 12 had been rotated from a reference or zero position. The output of the pulse counter 44 is shown connected to a controlled means 46, which responds to the count in the pulse counter 44. (By "pulse counter" is meant any means which changes state in accordance with the number of pulses fed thereto. A marker storage shift register is a pulse counter by this definition.)

The manually operable rotary pulse generating apparatus just described has applications in a wide variety of electrical circuits, in addition to timers. Where it is used in a timer as illustrated in FIG. 1, it may be used as a manual programming means for setting various turn-on or turn-off marks in storage locations of a shift register whose markers assigned to various time intervals are shifted one stage for each pulse generated by the pulse output of the debouncing circuit 42. In such an application, the time dial knob assembly 12 could be used by rotating the outer knob member counter-clockwise to a time setting identifying present time, such rotation not affecting the electrical circuitry involved since such rotation will not advance the shaft 29. Turn-on and turn-off markers can be inserted in appropriate accessed storage locations of the timer memory, for example, the first stage of said shift register, by manually rotating the dial knob assembly 12 clockwise from the present time setting to bring the proper hour or half-hour marker opposite the stationery index mark 14, to identify the beginning of an ON time interval. During the advancement of the time knob assembly 12 to this setting, each detented position of the time knob assembly will generate a pulse at the output debouncing circuit 42 which would shift any markers previously set into the shift register a number of stages equal to the number of pulses so generated, to keep track of the storage location in memory where the next marker is to be inserted. The placement of a turn-on or turn-off marker in the first stage of the shift register or other storage location in memory can be effected by a separate marker setting or by the depression of the control knob assembly 12, which alternately produces turn-on and turn-off markers, as disclosed in copending application Ser. No. 22,453 dated Mar. 21, 1979.

Refer now to FIG. 5 which shows a modified form of the dial knob assembly 12 previously described, which modified dial knob assembly is identified by reference numeral 12'. The dial knob assembly 12' is identical to dial knob assembly 12, except that the outer knob member 12A' thereof is transparent and the hour numbers 13 and the half-hour markers 13' are positioned on the periphery of the inner dial member 12B, so as to be visible through the outer dial knob member. This dial knob assembly 12' is useful, for example, in the timer disclosed in copending application U.S. Ser. No. 132,088, filed Mar. 20, 1980, entitled "Power Circuit Control Programmable Timer", wherein all time settings are made when the inner knob member is rotated in a clockwise direction first to a "present time" setting where the time dial knob assembly also acting as a pushbutton control is then depressed to enter present time, the advancement of the inner knob member up until the point when "present time" is entered having no effect on the pulse counter circuits involved. In this use of the invention, while there is thus no need to make a time setting by counter-clockwise rotation of the time dial knob assembly 12', the one-way clutch is utilized between the outer transparent member 12A' and the inner dial knob member 12B' to relieve the spring 35 from spring deforming or breaking stresses, should the user attempt to rotate the dial knob assembly 12' in a counter-clockwise direction.

While the debouncing circuit may take a variety of forms one especially simple and satisfactory circuit is shown in FIG. 6. As there shown, the input damped sine wave pulse waveform W1 which lasts for about 1 millisecond is fed to the set input 42-2a of a set-reset bistable 42-2 having a reset input 42-2b connected by a conductor 42-6 to the output of a one stage shift register 42-4. The shift register 42-4 has a data input terminal 42-4a which receives the "0" or "1" output of the set-reset bistable 42-2 through a current limiting resistor 42-1. A "1" signal fed to the shift register data input terminal 42-4a is transferred to the output 42-4c of the shift register when a shift pulse is fed to the shift pulse input terminal 42-4b thereof from a 300 Hz pulse source which produces successive pulses fed about 3 milliseconds apart.

The beginning of the waveform W1 fed to the set-reset bistable 42-2 will set the same which will switch the initially "0" output of the set-reset bistable to a "1" output. The next pulse from the 300 Hz source fed to the shift register input 42-4 transfers the "1" signal input fed to the shift register data input terminal 42-4a to the output 42-4c thereof. This "1" signal at the shift register output 42-4c coupled by conductor 42-6 to the reset input 42-2b of the set-reset bistable 42-2 resets the bistable to change the bistable output to a "0" signal which then is fed to the data input 42-4a of the shift register 42-4. Since this "0" signal is not transferred to the output of the shift register until the generation of the next 300 Hz shift pulse the output of the shift register remains a "1" bistable resetting "1" signal until making the bistable non-responsive to the pulsing set input signal W1 to the bistable until this next shift pulse is generated, by which time the 1 millisecond is a 3 millisecond "1" signal pulse at the output of the shift register 42-4 for each pulsing waveform W1 fed from the piezo-electric element output.

It should be understood that numbers modifications may be made in the most prefereed forms of the invention described with deviation from the broader applications of the invention.

I claim:

1. In electrical apparatus having control means responsive to the number of pulses fed to the input thereof, a manually operable pulse generating apparatus whose output is to be coupled to the input of said control means and comprising: a manually operable dial knob member movable in at least a first operating direction, a cam member having sawtooth ratchet teeth-forming lobes, means coupling said dial knob member to said cam member when said dial knob member is moved in said operating direction, a spring force-urged detenting and force-transmitting pawl member mounted to ride upon said sawtooth ratchet teeth-forming lobes, said pawl member normally located between adjacent lobes in a manner to detent the movement of said dial knob member and cam member, so that the dial knob member has discrete positions which it assumes as it is advanced in said operating direction, each of said lobes having a gradually rising leading side over which said pawl member rides when said knob member is moved in said operating direction and a sharply dropping trailing side, the spring force on said pawl member being such that the pawl member riding on any point of the gradually rising side of a lobe of said cam member will rotate the cam member to position the pawl member in the crotch between said gradually rising side of a lobe and the trailing side of the adjacent lobe, a stationary piezoelectric element with output terminals across which an appreciable damped waveform appears when the stress on the same is suddenly changed, said spring-urged pawl member applying an initial stress to said piezoelectric element as said pawl member rides up the leading side of a lobe of said cam, which stress reaches a maximum value and is suddenly relieved to generate a damped waveform at said output terminals when said pawl member falls off the high point of one of said lobes, and debouncing circuit means coupled between the output terminal of said piezoelectric element and the input of said control means to convert said damped waveform to a single pulse output.

2. The electrical apparatus of claim 1 wherein said dial knob and cam members are rotatable members, and wherein there is provided a one-way clutch interconnecting said dial knob member and cam member so that said cam member is moved by said knob member only when said knob member is moved in said operating direction.

3. In electrical apparatus having control means responsive to the number of pulses fed to the input thereof, a manually operable pulse generating means whose output is to be coupled to the input of said control means and comprising: a manually operable dial knob member movable in at least a first operating direction into discrete detented positions, piezoelectric means having output terminal means across which a single appreciable damped waveform appears when the piezoelectric means is subjected to a sudden change in stress, damped waveform producing means responsive to the movement of said dial knob member from one detented position to the other for effecting the application of said sudden change in stress, and debouncing circuit means coupled between the output terminal means of said piezoelectric element and the input of said control means to convert said damped waveform to a single pulse output.

4. The electrical apparatus of claim 1 wherein there is provided numbered markers along said dial knob member and an index mark opposite which a different numbered marker becomes aligned as said dial knob member is advanced to each detented position, said dial knob member being a transparent rotatable member, and there is provided an inner knob member around which said transparent dial knob member is rotatably mounted, said cam member being a rotatable member coupled for movement with said inner knob member, a one-way clutch interconnecting said outer dial knob member and said inner knob member so that said inner knob member is rotated only when said outer dial knob member is moved in said operating direction, and said numbered markers being placed on the periphery of said inner knob member so as to be seen through the transparent outer dial knob member.

5. The electrical apparatus of claims 1 or 2 wherein said pawl member is a spring having at one end a pawl-forming end which normally is engaged in the crotch between the trailing side of one lobe and the leading edge of the adjacent lobe of said cam member.

6. In electrical apparatus having control means responsive to the number of pulses fed to the input thereof, a manually operable pulse generating apparatus whose output is to be coupled to the input of said control means and comprising a manually operable dial knob member movable in at least a first operating direction, a cam member having sawtooth ratchet teeth-forming lobes, means coupling said dial knob member to said cam member when said dial knob member is moved in said operating direction, said coupling means comprising a spring force-urged detenting and force-transmitting pawl member formed by a spring having at one end a pawl-forming end, each of said lobes having a gradually rising leading side over which said pawl-forming end of the spring rides when said knob member is moved in said operating direction and a sharply dropping trailing side, the spring being stressed at least when the pawl-forming end member of said spring leaves said crotch and rides on any point of the gradually rising side of a lobe of said cam member, such stress in the absence of an external force causing the cam member to rotate to a position where said pawl-forming end of the spring is in the crotch between said gradually rising side of a lobe and the trailing side of the adjacent lobe, to detent the movement of said dial knob member and cam member, so that the dial knob member has discrete positions which it assumes as it is advanced in said operating direction, a stationary piezoelectric element with output terminals across which an appreciable damped waveform appears when the stress on the same is suddenly changed, said pawl-forming end of said spring joining a curved spring portion extending part way around a cylindrical pivot-forming member and terminating in a flat spring end bearing against a side of said piezoelectric element, said pawl-forming end of said spring being urged toward the opposite end of the spring bearing against said piezoelectric element to progressively compress the same as the dial knob member is advanced from one detented position toward the next detented position thereof, said pawl-forming end of the spring applying an initial stress to said piezoelectric element as said pawl member starts to ride up the leading side of a lobe of said cam member, which stress reaches a maximum value and is suddenly relieved to generate a damped waveform at said output terminals when said pawl-forming end of the spring falls off the high point of one of said lobes.

7. The apparatus of claims 1 or 2 combined with a debouncing means coupled to the output terminals of said piezo-electric element to produce a single pulse from the pulse waveform generated at said terminals, and a pulse counting circuit coupled to the output of said debouncing means.

8. The electrical apparatus of claim 1 or 3 wherein there is provided numbered markings along said dial knob member and an index mark opposite which a different numbered marking becomes aligned as said dial knob member is advanced to each detented position thereof.

9. The electrical apparatus of claim 8 wherein said damped waveform producing means includes a cam member having sawtooth ratchet teeth-forming lobes, means coupling said dial knob member to said cam member when said dial knob member is moved in said operating direction, a spring-urged force-transmitting pawl member mounted to ride upon said sawtooth ratchet teeth-forming lobes, each of said lobes having a gradually rising leading side and a sharply dropping trailing side over which sides said pawl member rides when said knob member is moved in said operating direction between said discrete positions, said piezoelectric means developing an appreciable damped waveform when the stress on the same is suddenly relieved, and said spring-urged pawl member applying an initial stress to said piezoelectric means as said pawl member rides up the leading side of a lobe of said cam, which stress reaches a maximum value and is suddenly relieved to generate an appreciably damped waveform at said output terminal means when said pawl member falls off the high point of one of said lobes.

10. The electrical apparatus of claim 3 wherein said damped waveform producing means includes a cam member having sawtooth ratchet teeth-forming lobes, means coupling said dial knob member to said cam member when said dial knob member is moved in said operating direction, and a spring force-urged detenting and force-transmitting pawl member mounted to ride upon said sawtooth ratchet teeth-forming lobes, wherein there is provided means for operating said damped waveform producing means when said dial knob member is moved in said operating direction.

* * * * *